(12) United States Patent
Jung et al.

(10) Patent No.: US 7,847,303 B2
(45) Date of Patent: Dec. 7, 2010

(54) WARM WHITE LIGHT EMITTING APPARATUS AND BACK LIGHT MODULE COMPRISING THE SAME

(75) Inventors: Jung Hwa Jung, Ansan-si (KR); Sang Min Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/775,911

(22) Filed: May 7, 2010

(65) Prior Publication Data
US 2010/0219428 A1   Sep. 2, 2010

Related U.S. Application Data

(62) Division of application No. 12/324,091, filed on Nov. 26, 2008.

(30) Foreign Application Priority Data
Jul. 29, 2008 (KR) .................. 10-2008-0074113
Nov. 13, 2008 (KR) .................. 10-2008-0112863

(51) Int. Cl.
*H01L 29/20* (2006.01)
(52) U.S. Cl. ............... 257/89; 257/98; 257/E33.001
(58) Field of Classification Search ............ 257/89, 257/98, E33.001
See application file for complete search history.

(56) References Cited

U.S. PATENT DOCUMENTS

| | | | |
|---|---|---|---|
| 5,770,111 A | 6/1998 | Moriyama et al. | |
| 5,839,718 A | 11/1998 | Hase et al. | |
| 5,885,483 A | 3/1999 | Hao et al. | |
| 6,093,346 A | 7/2000 | Xiao et al. | |
| 6,267,911 B1 | 7/2001 | Yen et al. | |
| 6,936,857 B2 | 8/2005 | Doxsee et al. | |
| 7,679,281 B2* | 3/2010 | Kim et al. | 313/501 |
| 2002/0117674 A1 | 8/2002 | Sugawara | |
| 2007/0069643 A1 | 3/2007 | Brunner et al. | |
| 2007/0223219 A1 | 9/2007 | Medendorp, Jr. et al. | |
| 2009/0050912 A1 | 2/2009 | Chu et al. | |
| 2009/0303694 A1 | 12/2009 | Roth et al. | |
| 2010/0001648 A1 | 1/2010 | De Clercq et al. | |
| 2010/0118510 A1 | 5/2010 | Bailey et al. | |

OTHER PUBLICATIONS

PCT International Search Report mailed Jan. 13, 2010 in International Application No. PCT/KR2009/003210.
PCT Written Opinion of the international Searching Authority mailed Jan. 13, 2010 in International Application NO. PCT/KR2009/003210.
Notice of Allowance dated Jul. 23, 2010 in U.S. Appl. No. 12/324,091.

* cited by examiner

*Primary Examiner*—Trung Dang
(74) *Attorney, Agent, or Firm*—H.C. Park & Associates, PLC

(57) ABSTRACT

A warm white light emitting apparatus includes a first light emitting diode (LED)-phosphor combination to generate a base light that is white or yellowish white and a second LED-phosphor combination to generate a Color Rendering Index (CRI) adjusting light. The base light and the CRI adjusting light together make a warm white light having a color temperature of 2500 to 4500K.

22 Claims, 10 Drawing Sheets

WARM WHITE LIGHT EMITTING APPARATUS AND BACK LIGHT MODULE COMPRISING THE SAME

CROSS REFERENCE TO RELATED APPLICATIONS

This application is a divisional of U.S. patent application Ser. No. 12/324,091 filed Nov. 26, 2008 and claims priority from and the benefit of Korean Patent Application No. 10-2008-0074113, filed on Jul. 29, 2008, and Korean Patent Application No. 10-2008-0112863, filed on Nov. 13, 2008, which are both hereby incorporated by reference for all purposes as if fully set forth herein.

BACKGROUND OF THE INVENTION

1. Field of the Invention

Exemplary embodiments of the present invention relates to a warm white light emitting apparatus, and more particularly, to a warm white light emitting apparatus that includes is an LED-phosphor combination to generate a base light of white or yellowish white and an LED-phosphor combination to generate light to adjust a Color Rendering Index (CRI) of the base light.

2. Discussion of the Background

A white light emitting apparatus using light emitting diodes (LEDs) as light sources to emit white light has been increasingly developed. An LED includes a junction of p-type and n-type semiconductors and uses a light emitting semiconductor in which energy corresponding to a bandgap of the semiconductor is emitted in the form of light due to a recombination of electrons and holes when voltage is applied thereto.

A white light emitting apparatus to emit white light using LEDs of three primary colors, i.e., red, green, and blue, is known. The white light emitting apparatus, however, may have a complicated circuit configuration, may make it difficult to provide uniform white light due to the difference of distances between the LEDs of the three primary colors, and may not be economically efficient. Further, in the white light emitting apparatus using the LEDs of the three primary colors, color rendering and color reproduction properties of white light may be limited.

FIG. 16 is a Commission on Illumination (CIE) 1931 chromaticity diagram showing full colors of a conventional white light emitting apparatus. Referring to FIG. 16, a triangle region defined by color coordinates of three primary colors used in the NTSC regulations exists on the CIE 1931 chromaticity diagram. Light of a white region may be provided depending on a change in slope of a curve according to current applied to red (R), green (G), and blue (B) LEDs in the triangle region. At this time, the white region is shown along a is black body locus curve (BBL curve), wherein the slope of the BBL curve increases from infinity to about 4000K and then decreases after it passes through about 4000K, based on x and y axes that are the abscissa and the ordinate, respectively. Therefore, light of a warm white region that is shown along the BBL curve and has an excellent color rendering property may not be provided using only the red, green, and blue LEDs.

There is also known a white light emitting apparatus that emits white light using the combination of a blue LED and a yellow phosphor. Such a white light emitting apparatus advantageously may provide a simple circuit configuration and may be inexpensive. However, its color rendering property may be degraded, and its color production property may be considerably degraded due to a low light intensity in a long wavelength.

Further, there is a conventional white light emitting apparatus that emits white light using the combination of a blue LED and red and green phosphors having different excitation wavelengths. Since the white light emitting apparatus has red, green, and blue peak wavelengths, the white light emitting apparatus has color rendering and color reproduction properties superior to a light emitting apparatus using a yellow phosphor. However, in such a light emitting apparatus, different kinds of phosphors are positioned in an encapsulant without being separated from each other. For this reason, light loss may be high, and efficiency of the phosphors may be degraded.

SUMMARY OF THE INVENTION

The present invention provides a warm white light emitting apparatus in which an LED-phosphor combination to generate a base light of white or yellowish white and another LED-phosphor combination to adjust a Color Rendering Index (CRI) of the base light are is employed to simply provide high quality warm white light near the BBL curve.

The present invention also provides a warm white light emitting apparatus in which high quality warm white light near the BBL curve may be simply provided using two LED-phosphor combinations, and an alternating current (AC) LED suitable for large-sized electronic display boards or large-sized monitors as an LED is used in each LED-phosphor combination to generate a base light.

Additional features of the invention will be set forth in the description which follows, and in part will be apparent from the description, or may be learned by practice of the invention.

Exemplary embodiments of the present invention disclose a warm white light emitting apparatus including a first LED-phosphor combination to generate a base light that is white or yellowish white and a second LED-phosphor combination to generate a CRI adjusting light. The base light and the CRI adjusting light together make a warm white light having a color temperature of 2500 to 4500K.

Exemplary embodiments of the present invention also disclose a warm white light emitting apparatus including a first combination of at least one AC LED and at least one kind of phosphor to generate a base light that is white or yellowish white and a second combination of at least one direct current (DC) LED and at least one phosphor to generate a CRI adjusting light. The base light and the CRI adjusting light together make a warm white light.

Exemplary embodiments of the present invention also disclose a backlight module including a light guide plate, and a warm white light emitting apparatus to supply light to a side surface of the light guide plate. The warm white light emitting apparatus includes an outer wall to define a space in which the first and second LED-phosphor combinations are disposed and a partition wall to separate the first and second LED-phosphor combinations from each other. The outer wall is adjacent to the side surface of the light guide plate, and the partition wall has a lower height than the outer wall to be spaced apart from the side surface of the light guide plate.

Exemplary embodiments of the present invention further disclose a warm white light emitting apparatus including a first combination and a second combination. The first combination includes a blue LED having a peak wavelength of 400 to 470 nm and at least one phosphor having a peak wavelength of 500 to 600 nm and generates a base light that is white or yellowish white. The second combination includes a blue LED having a peak wavelength of 400 to 470 nm and at least one phosphor having a peak wavelength greater than 600 nm and generates a CRI adjusting light. The base light and the CRI adjusting light together make a warm white light.

Exemplary embodiments of the present invention additionally disclose a warm white light emitting apparatus including a first combination and a second combination. The first combination includes a blue LED having a peak wavelength of 400 to 470 nm and at least one phosphor having a peak wavelength of 500 to 600 nm and generates a base light that is white or yellowish white. The second combination includes an ultra violet (UV) LED having a peak wavelength of 250 to 400 nm and at least one phosphor having a peak wavelength greater than 600 nm and generates a CRI adjusting light. The base light and the CRI adjusting light together make a warm white light.

Exemplary embodiments of the present invention also disclose a warm white light emitting apparatus including a first combination and a second combination. The first combination includes an AC LED having a peak wavelength in a blue region and at least one phosphor having a peak wavelength of 500 to 600 nm. The second combination includes a DC LED having a peak wavelength in a UV or blue region and at least one phosphor having a peak wavelength greater than 600 nm.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1:
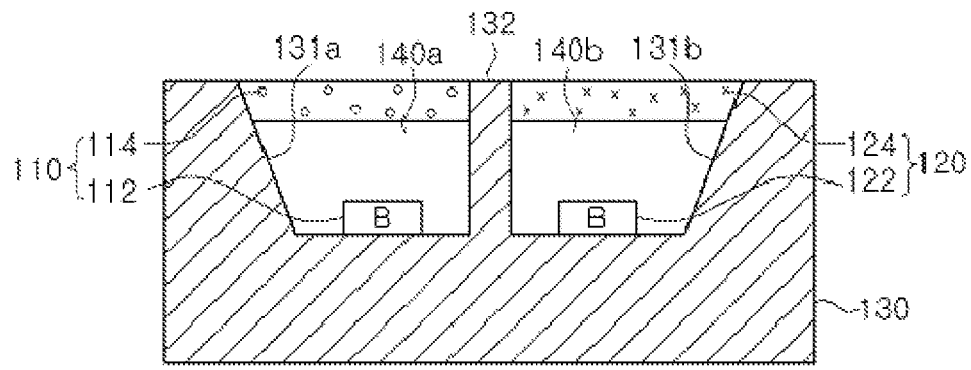
FIG. 1, FIG. 2, FIG. 3, FIG. 4, FIG. 5, FIG. 6, FIG. 7, and FIG. 8 are sectional views of warm white light emitting apparatuses according to exemplary embodiments of the present invention in which a plurality of LED-phosphor combinations are positioned in a single package.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

According to a typical classification reference, white light is classified as warm is white light, pure white light, or cool white light depending on the color temperature of the white light. However, the "warm white light" is herein defined as white light except cool white light, i.e., white light including typical warm white light and pure white light. Herein, the term "base light" refers to light that is a material of the warm white light to be finally obtained, which has an excellent color rendering property near a BBL curve.

Light emitting apparatuses according to first, second, and third exemplary embodiments of the present invention, in which warm white light is provided by two LED-phosphor combinations that each include a blue LED, will be described with reference to FIG. 1, FIG. 2, and FIG. 3.

Use of Blue LEDs: First, Second, and Third Exemplary Embodiments

FIG. 1 is a sectional view of a warm white light emitting apparatus according to the first exemplary embodiment of the present invention.

As shown in FIG. 1, the warm white light emitting apparatus according to the first exemplary embodiment of the present invention includes first and second LED-phosphor combinations 110 and 120, and a housing 130 having cavities to accommodate LEDs and phosphors of the combinations. In this exemplary embodiment, the housing 130 includes two cavities 131a and 131b that are independent of each other. Transparent encapsulants 140a and 140b to protect LEDs and the like may be formed in the cavities 131a and 131b, respectively.

In this exemplary embodiment, the first LED-phosphor combination 110 includes a first blue LED 112 and a yellow phosphor 114 corresponding to the first blue LED 112. Also, the second LED-phosphor combination 120 includes a second blue LED 122 and a red phosphor 124 corresponding to the second blue LED 122. The first and second blue LEDs 112 and 122 have a peak wavelength range of about 400 to 470 nm. For example, the yellow phosphor 114 is provided in the first LED-phosphor combination 110 may have a peak wavelength range of about 500 to 600 nm.

In this exemplary embodiment, although the yellow phosphor 114 in the first LED-phosphor combination 110 may be a single yellow phosphor, the present invention is not limited thereto. That is, two or more kinds of phosphors having a peak wavelength range of 500 to 600 nm may be used as the phosphor 114 of the first LED-phosphor combination 110. For example, a phosphor having a peak wavelength range of 500 to 550 nm and a phosphor having a peak wavelength range of 550 to 600 nm may be used together as the phosphor 114 of the first LED-phosphor combination 110.

The first LED-phosphor combination 110 generates base light of white or yellowish white through the combination of blue light emitted from an LED and yellow light emitted from a phosphor. In the first LED-phosphor combination 110, a portion of blue light emitted from the first blue LED 112 excites the yellow phosphor 114. The yellow phosphor 114 can allow blue light to be wavelength-converted into yellow light by the excitation. The rest of the blue light emitted from the first blue LED 112 dose not collide with the yellow phosphor 114 and advances as it is. The base light of white or yellowish white is generated through a mixture of the yellow light generated by the wavelength conversion and the blue light that is not wavelength-converted.

However, since the color rendering property of the base light may be considerably degraded, it may be necessary to adjust the CRI. Accordingly, the base light may be mixed with CRI adjusting light generated by the second LED-phosphor combination 120, as described below, in order to generate warm white light near a BBL curve.

The second LED-phosphor combination 120 generates CRI adjusting light, which is mixed with the base light generated from the first LED-phosphor combination 110. It may be difficult to provide the warm white light near the BBL curve using a single LED-phosphor combination. However, the warm white light near the BBL curve may be generated by the mixture of the base light generated by the first LED-phosphor combination 110 and the CRI adjusting light generated by the second LED-phosphor combination 120. A single red phosphor having a peak wavelength range greater than 600 nm may be used as the red phosphor 124 of the second LED-phosphor combination 120.

Figure 15:
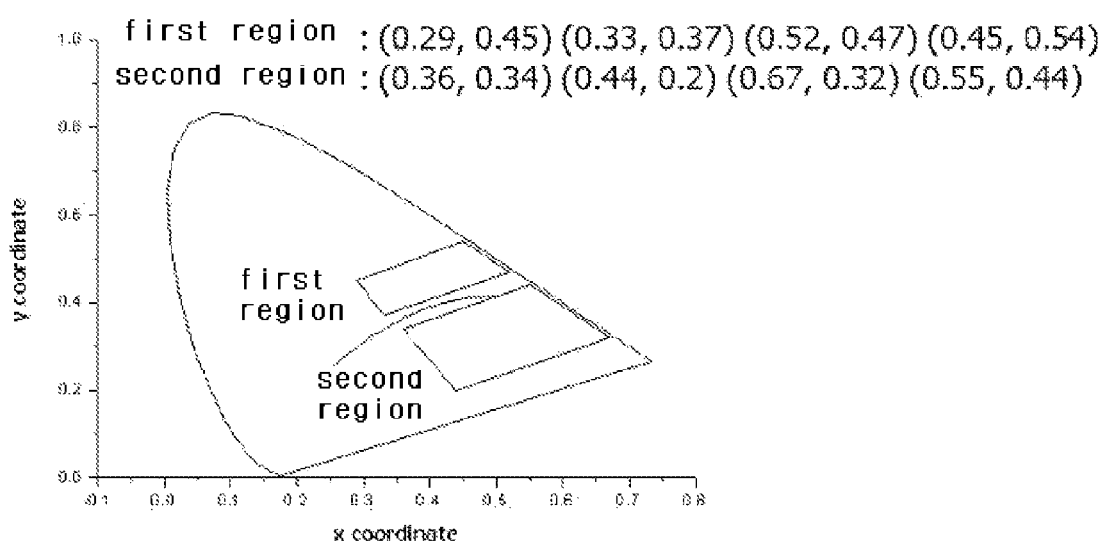
FIG. 15 is a view showing regions of base light and CRI adjusting light defined by color coordinates on a CIE 1931 chromaticity diagram to obtain warm white light according to an exemplary embodiment the present invention.
Figure 16:
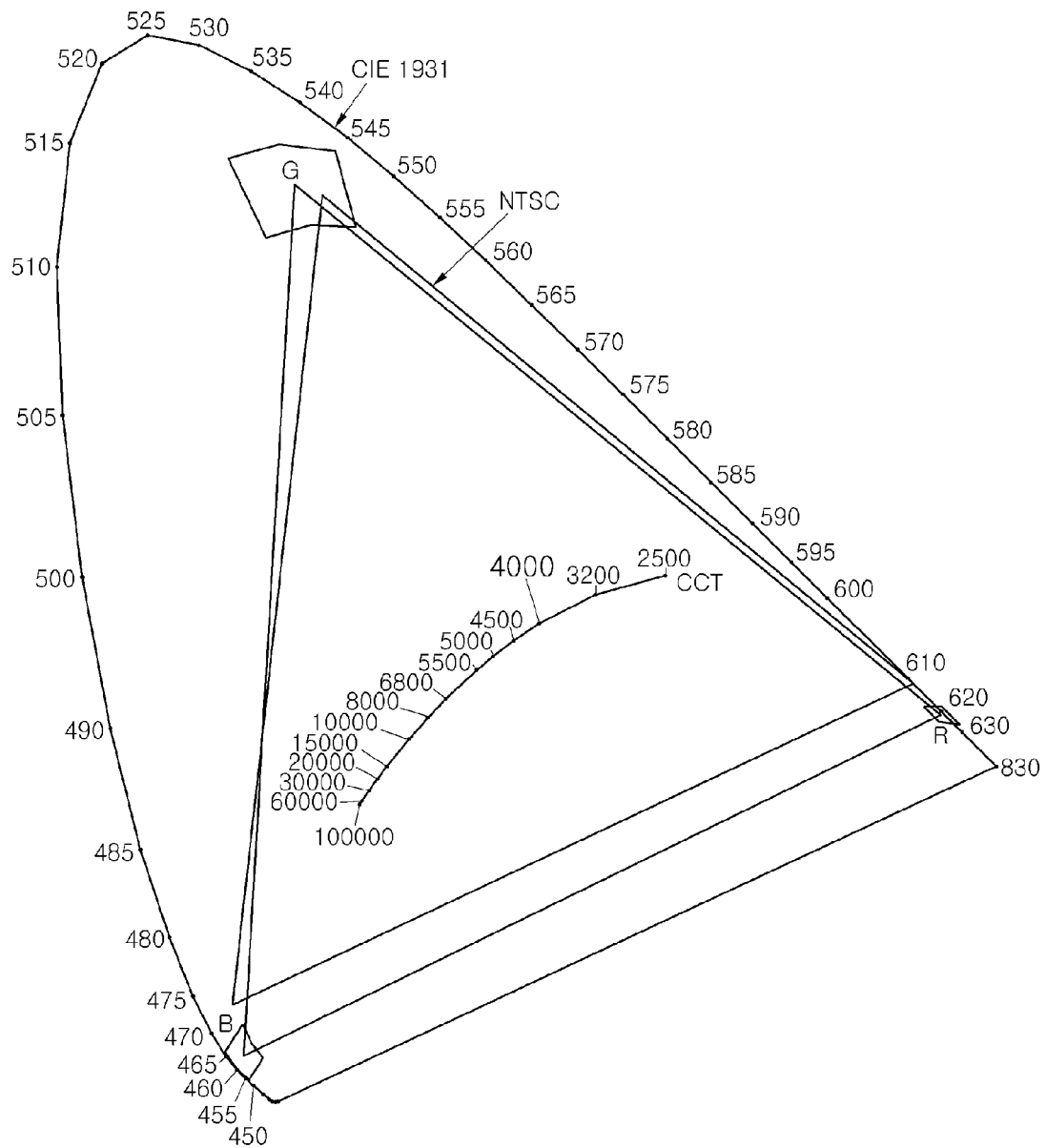
FIG. 16 is a CIE 1931 chromaticity diagram showing full colors of a conventional warm white light emitting apparatus.

It is advantageous that the color coordinate range of the base light be as distant from the BBL curve as possible on a CIE 1931 chromaticity diagram as shown in FIG. 15, i.e., that a Y-coordinate of the CIE 1931 chromaticity diagram is large. However, the color coordinate range of the base light may be determined to the extent that the color coordinate range can be drawn near the BBL curve due to the CRI adjusting light having an almost fixed color coordinate range.

The base light generated by the first LED-phosphor combination 110 is determined to exist in a first rectangular region defined by color coordinates (0.29, 0.45), (0.33, 0.37), (0.52, 0.47), and (0.45, 0.54). The CRI adjusting light generated by the second LED-phosphor combination 120 is determined to exist in a second rectangular region defined by color coordinates (0.36, 0.34), (0.44, 0.20), (0.67, 0.32), and (0.55, 0.44). At this time, the light obtained by the first and second LED-phosphor combinations 110 and 120 is not cool white light but warm white light and exists near the BBL curve. The obtained warm white light may have a color temperature range of about 2500 to 4500K, most preferably 2500K to 3500K.

The yellow phosphor 114 capable of providing the color coordinate region of the base light together with the blue LED may include at least one of orthosilicate based yellow, amber, and green phosphors. The yellow and green phosphors may be $(Ba, Sr, Ca, Cu)_2SiO_4:Eu$, and the amber phosphor may be $(Ba, Sr, Ca)_2SiO_4:Eu$. In addition, various kinds of phosphors such as YAG:Ce, Tag-Ce, and $Sr_3SiO_5:Eu$ may be used in the first LED-phosphor combination 110.

For example, a nitride-based red phosphor, such as $(Ca, Sr, Ba)_2Si_5N_8:Eu$, $(Mg, Ca, Sr)AlSiN_3:Eu$, $(Ca, Sr, Ba)Si_7N_{10}:Eu$, or $(Ca, Sr, Ba)SiN_2:Eu$, may be used as the red phosphor 124 capable of providing the color coordinate region of the CRI adjusting light together with a blue LED or an ultraviolet (UV) LED. For example, $CaAlSiN_3:Eu$ may be used as the red phosphor 124.

The second LED phosphor combination 120 may be completely separated from the first LED-phosphor combination 110 by a partition wall 132 formed between the cavities 131a and 131b. Accordingly, it may be possible to prevent the phosphors and LEDs of the first and second LED-phosphor combinations 110 and 120 from operating in exchange for each other until light is generated by the respective first and second LED-phosphor combinations 110 ad 120 themselves. Inner wall surfaces of the two cavities 131a and 131b may be inclined reflective surfaces. However, inner wall surfaces defined by the partition wall 132 may be vertical or inclined less than the other inner surfaces. Alternatively, the partition wall 132 may be omitted, and the phosphors of the first and second LED-phosphor combinations 110 and 120 may be independently separated from each other in a cluster form, which is also in the scope of exemplary embodiments of the present invention. Light emitted from the LED of one combination may have no influence on the phosphor of the other combination. However, in some exemplary embodiments there may be a slight influence on the phosphor of one combination by light emitted from the LED of the other combination.

In this exemplary embodiment, the first and second LEDs 112 and 122 belong to the first and second LED-phosphor combinations 110 and 120 and are positioned on the bottom surfaces of the first and second cavities 131a and 131b, respectively. The yellow phosphor 114 of the first LED-phosphor combination 110 and the red phosphor 124 of the second LED-phosphor combination 120 are positioned over the top surfaces of the first and second encapsulants 140a and 140b independently formed in the first and second cavities 131a and 131b, respectively. Although not shown, the housing 130 may be provided with lead terminals to supply power to the LEDs 112 and 122.

The phosphors 114 and 124 may be in the form of particles and may be contained in a coating layer or a secondarily molded body formed on the top surface of the encapsulants 140a and 140b. Alternatively, the yellow and red phosphors 114 and 124 may be in the form of particles and may be contained in a film adhering to the top surface of the encapsulants 140a and 140b. Although not shown, the yellow phosphor 114 and the red phosphor 124 may be widely scattered in the form of particles in the first and second encapsulants 140a and 140b, respectively.

As briefly described above, the second LED-phosphor combination 120 may generate pink light close to red light, i.e., CRI adjusting light, which is mixed with the base light generated from the first LED-phosphor combination 110 to adjust the CRI of the base light. In the second LED-phosphor combination 120, blue light emitted from the second blue LED 122 excites the red phosphor 124. The red phosphor 124 may generate pink light that is wavelength-converted by the excitation. The pink light may be used to adjust the color temperature of white light.

Ideally, all light emitted from the second blue LED 122 acts with the red is phosphor 124. However, a portion of blue light emitted from the second blue LED 122 may be emitted to the outside as it is. Although such blue light may be emitted from the second LED-phosphor combination 120, the blue light may be mixed with yellow light wavelength-converted by the yellow phosphor 114 of the first LED-phosphor combination 110 to generate the aforementioned white light, which means that the emission of blue light from the second LED-phosphor combination 120 may be unlimited.

Figure 2:
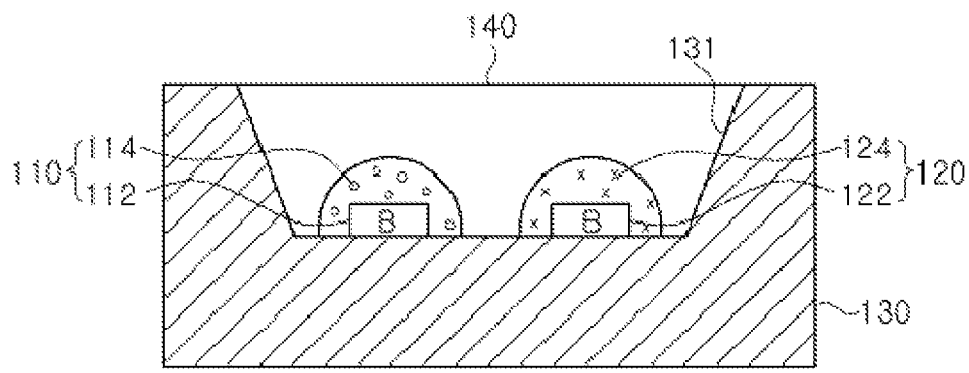

FIG. 2 is a sectional view of a warm white light emitting apparatus according to the second exemplary embodiment of the present invention. Referring to FIG. 2, the warm white light emitting apparatus according to the second exemplary embodiment of the present invention includes a first LED-phosphor combination 110 having a first blue LED 112 and a yellow phosphor 114 and a second LED-phosphor combination 120 having a second blue LED 122 and a red phosphor 124, like the previous exemplary embodiment.

The second exemplary embodiment is different from the previous exemplary embodiment in that an encapsulant 140 is positioned in a single cavity 131 of a housing 130, and the yellow and red phosphors 114 and 124 are formed differently in position and method. In this exemplary embodiment, the yellow and red phosphors 114 and 124 individually cover the first and second LEDs 112 and 122, respectively. The method of covering an LED with a phosphor may include a method of dotting an LED with a liquid resin containing a phosphor, a method using a reflector containing a phosphor, a method of coating an LED with a phosphor through electrophoresis, and the like.

In this exemplary embodiment, the first blue LED 112 and the yellow phosphor 114 covering the first blue LED 112 constitute the first LED-phosphor combination 110 to generate base light of white or yellowish white, and the second blue LED 122 and the red is phosphor 124 covering the second blue LED 122 constitute the second LED-phosphor combination 120 to generate pink light for CRI adjustment.

Figure 3:
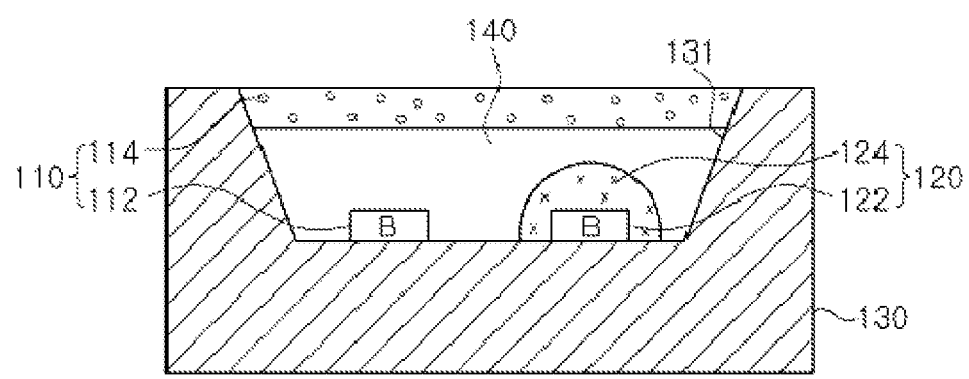

FIG. 3 is a sectional view of a warm white light emitting apparatus according to the third exemplary embodiment of the present invention. Like the previous exemplary embodiment, the warm white light emitting apparatus according to the third exemplary embodiment of the present invention includes a first LED-phosphor combination 110 having a first blue LED 112 and a yellow phosphor 114 and a second LED-phosphor combination 120 having a second blue LED 122 and a red phosphor 124, and both of the first and second LED-phosphor combinations 110 and 120 are positioned in a single cavity 131 of a housing 130.

The third exemplary embodiment is different from the previous exemplary embodiment in that only the second blue LED 122 of the second LED-phosphor combination 120 is individually covered with the red phosphor 124, and the blue LED 112 of the first LED-phosphor combination 110 is encapsulated with only an encapsulant 140. The yellow phosphor 114 of the first LED-phosphor combination 110 is provided on the top surface of the encapsulant 140 or inside of the encapsulant 140. In this exemplary embodiment, the encapsulant 140 encapsulates both of the red phosphor 124 and the second blue LED 122 covered with the red phosphor 124 as well as the first blue LED 112.

According to this exemplary embodiment, in first LED-phosphor combination 110, a portion of blue light emitted from the first LED 112 is wavelength-converted into yellow light by the yellow phosphor 114 positioned on the top surface of the encapsulant 140 (or inside of the encapsulant 140), and the rest of the blue light is mixed with the yellow light without wavelength conversion, thereby generating base light of white or yellowish white. In the second LED-phosphor combination 120, a large amount of blue light emitted from the second is blue LED 122 is converted into pink light, which is used to adjust the color temperature of white light, by the red phosphor 124 directly and individually covering the second blue LED 122. At this time, since the yellow phosphor 114 has an energy level much higher than that of the red phosphor 124, light emitted by exciting the red phosphor 124 may have substantially no influence on the yellow phosphor 114. Accordingly, only the second LED 122 may be individually covered with the red phosphor 124.

Hereinafter, a warm white light emitting apparatus according to a fourth exemplary embodiment, in which a UV LED is partially used, will be described with reference to FIG. 4.

Use of Blue LED and UV LED: Fourth Exemplary Embodiment

Figure 4:
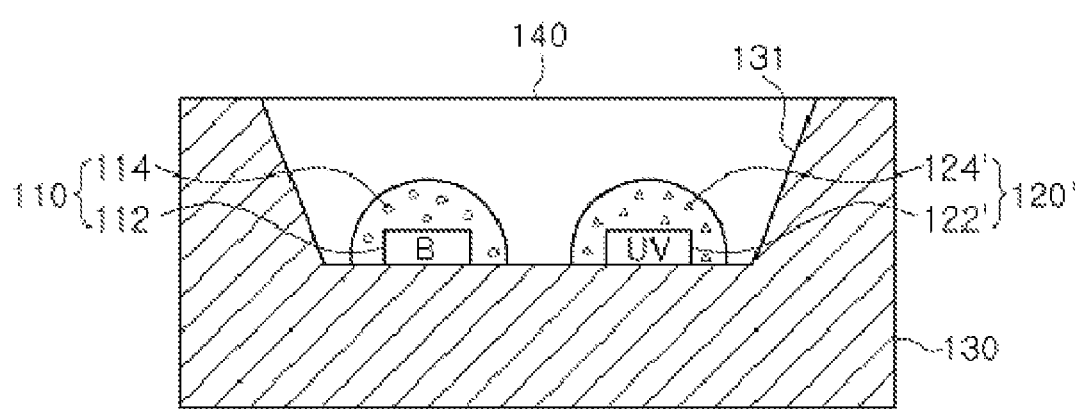

FIG. 4 is a sectional view of a warm white light emitting apparatus according to the fourth exemplary embodiment of the present invention. Referring to FIG. 4, the warm white light emitting apparatus according to the fourth exemplary embodiment of the present invention includes a first LED-phosphor combination 110 having a blue LED 112 and a yellow phosphor 114, and a second LED-phosphor combination 120' having a UV LED 122' and a red phosphor 124'. Both of the first and second LED-phosphor combinations 110 and 120' are positioned in a single cavity 131 of a housing 130. The blue LED 112 and the UV LED 122' are individually covered with the yellow phosphor 114 and the red phosphor 124', respectively. An encapsulant 140 encapsulates all of the elements of the first and second LED-phosphor combinations 110 and 120'. Here, in the second LED-phosphor combination 120', the red phosphor 124' may have a peak wavelength range greater than 600 nm and the UV LED 122' may have a peak wavelength range of 250 to 400 nm.

Although not specifically shown, the structure in which the first and second LED-phosphors are separated from each other may be variously modified as long as a UV LED is used in the second LED-phosphor combination to generate CRI adjusting light (see FIGS. 1, 12, 13, and 14).

Hereinafter, warm white light emitting apparatuses according to fifth, sixth, seventh, and eighth exemplary embodiments of the present invention, wherein an AC LED is used as a blue LED in a first LED-phosphor combination to generate base light, will be described with reference to FIG. 5, FIG. 6, FIG. 7, FIG. 8, FIG. 9, FIG. 10, and FIG. 11.

Use of AC LED: Fifth, Sixth, Seventh, and Eighth Exemplary Embodiments

Figure 5:
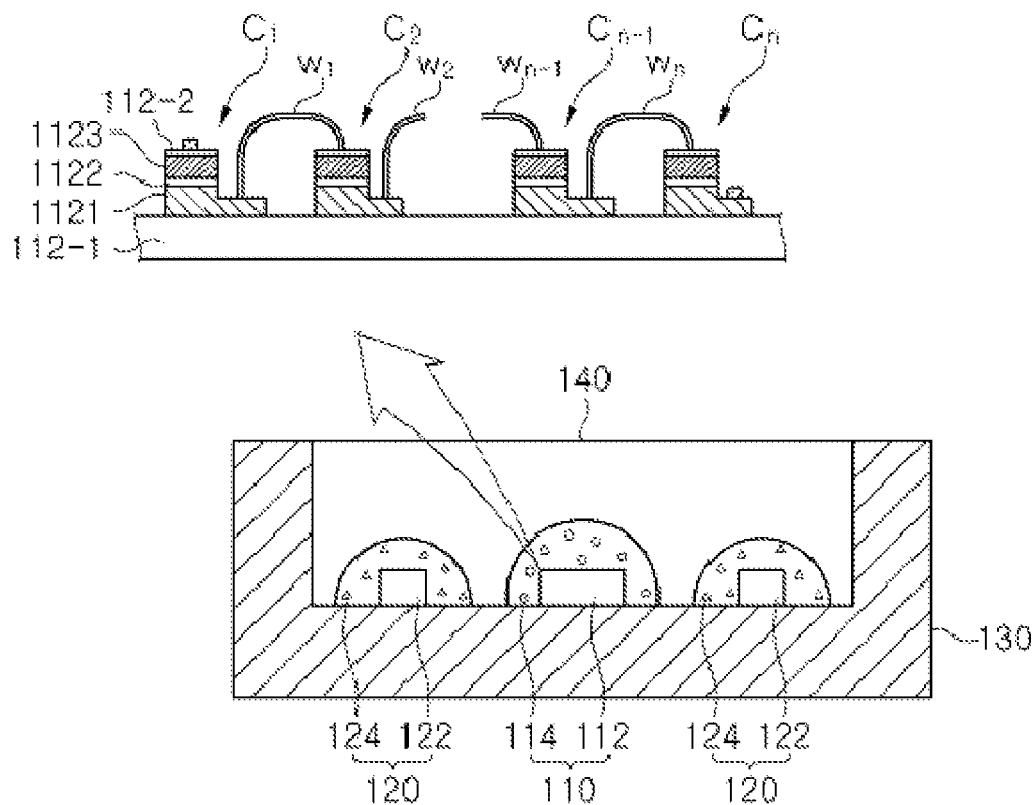

FIG. 5 is a sectional view of a warm white light emitting apparatus according to the fifth exemplary embodiment of the present invention. Referring to FIG. 5, the warm white light emitting apparatus according to the fifth exemplary embodiment of the present invention includes a first LED-phosphor combination 110 and a plurality of second LED-phosphor combinations 120, which are positioned in a single package housing 130. At this time, the plurality of second LED-phosphor combinations 120 is disposed around the first LED-phosphor combination 110. In this exemplary embodiment, base light of white or yellowish white, which is generated from the first LED-phosphor combination 110, is equally mixed with CRI-mixed light generated from the plurality of second LED-phosphor combinations 120 disposed around the first LED-phosphor combination 110. Accordingly, the combinations 110 and 120 may generate uniform warm white light without color variation.

The first blue LED 112 of the first LED-phosphor combination 110 may be an AC LED operated by AC current. FIG. 5 is an enlarged view of the configuration of an AC LED chip. Referring to the enlarged view, the AC LED chip is formed by growing semiconductor layers on a substrate 112-1. The AC LED chip includes a plurality of light emitting cells $C_1$, $C_2$, ..., $C_{n-1}$, and $C_n$ connected in series through wires $W_1$, $W_2$, ... $W_{n-1}$, and $W_n$.

Each light emitting cell $C_1$, $C_2$, ..., $C_{n-1}$, and $C_n$ includes an n-type semiconductor layer 1121, an active layer 1122, and a p-type semiconductor layer 1123, which are sequentially formed on the substrate 112-1 or a buffer layer (not shown) formed on the substrate 112-1. At this time, a transparent electrode layer 112-2 may be formed on the p-type semiconductor layer 1123. Further, a portion of the active layer 1122 and the p-type semiconductor layer 1123 is removed in a region of the n-type semiconductor layer 1121, so that an electrode may be provided in the region of the n-type semiconductor layer 1121. For example, the electrode may be connected to a p-type semiconductor layer of an adjacent light emitting cell through the wire.

The wire $W_1$ connects the n-type semiconductor layer 1121 of the light emitting cell $C_1$ to the electrode of the p-type semiconductor layer 1123 of another adjacent light emitting cell $C_2$. A serial array of the plurality of light emitting cells may be connected in reverse parallel with a serial array of other light emitting cells formed on the same substrate.

As described above, the AC LED 112 may be formed by growing an n-type semiconductor layer, an active layer, and a p-type semiconductor layer on a substrate, dividing the semiconductor layers into a plurality of light emitting cells $C_1$, $C_2, \ldots, C_{n-1}$, and $C_n$, and then connecting the light emitting cells in series or parallel. Alternatively, the AC LED may be formed by mounting a plurality of prefabricated LED chips on a submount and then connecting the plurality of LED chips mounted on the submount in series or parallel. In this case, a material of the submount may include any one of AlN, Si, Cu, Cu—W, $Al_2O_3$, SiC, ceramic, and the like. If necessary, a material to isolate the submount from each LED chip may be disposed between the submount and each LED chip.

Meanwhile, since an AC LED connected to an AC power source is repeatedly is turned on/off depending on a direction of current, the flickering phenomenon where light emitted from the AC LED flickers occurs. Here, if a DC LED operated by DC current is used as an LED 122 of each second LED-phosphor combination 120, flickering may be reduced. In order to further reduce flickering and total harmonic distortion (THD), an anti-coupling circuit unit and/or an anti-THD circuit unit may be connected in the form of a device or IC to an AC LED or an operation circuit thereof. Further, a current control unit, which controls current flowing through the AC LED to be different depending on a change in temperature of the AC LED and/or the DC LED, may be connected to the operation circuit of the AC LED.

Figure 6:
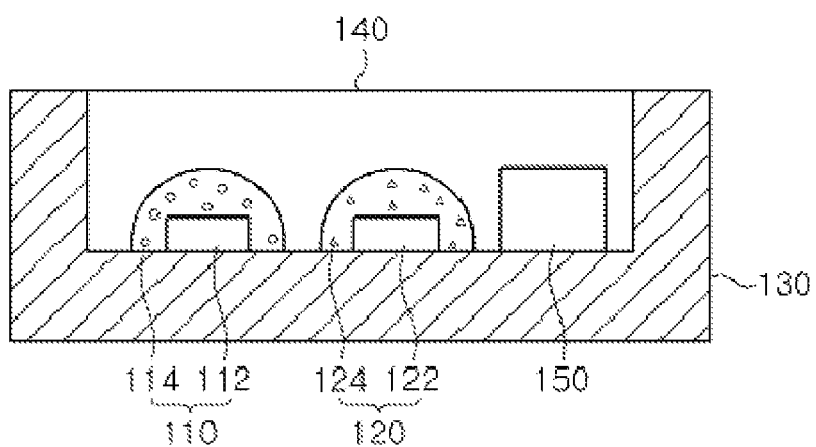

FIG. 6 is a sectional view of a warm white light emitting apparatus according to the sixth exemplary embodiment of the present invention, and shows the warm white light emitting apparatus, which further includes an additional circuit unit 150 to reduce flickering or the like in a package. The circuit unit 150 may be an anti-flickering circuit unit to reduce flickering or an anti-THD circuit unit to reduce THD. The circuit unit 150 is connected to a lead terminal (not shown) connected to an AC LED 112 of a first LED-phosphor combination 110. The anti-flickering circuit unit and/or the anti-THD circuit unit may be embedded in a package together with the circuit unit 150 shown in FIG. 6, or may be connected to the AC LED 112 at the outside of the package. A DC LED 122 of a second LED-phosphor combination 120 may be connected to an electric circuit independent from a power source of the AC LED 112, or may be connected to an additional circuit unit to improve performance of the DC LED.

Figure 7:
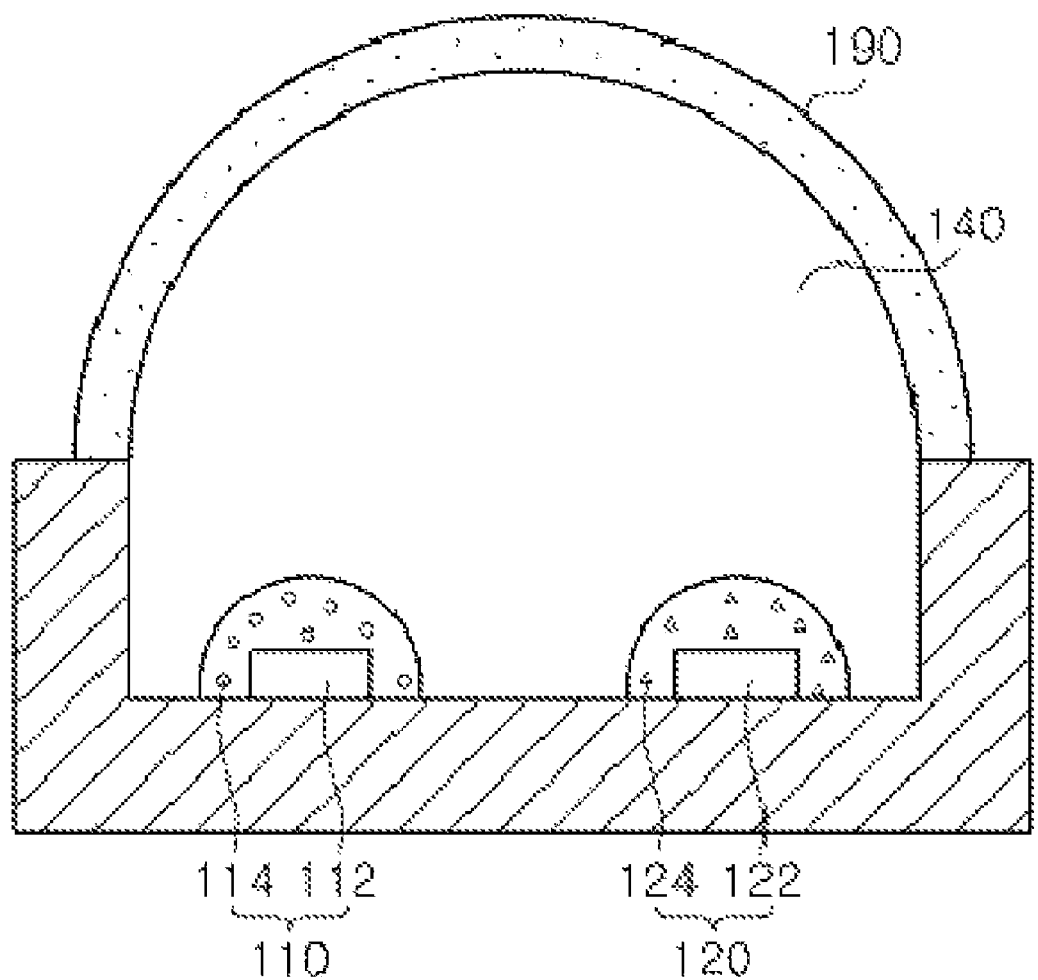
Figure 8:
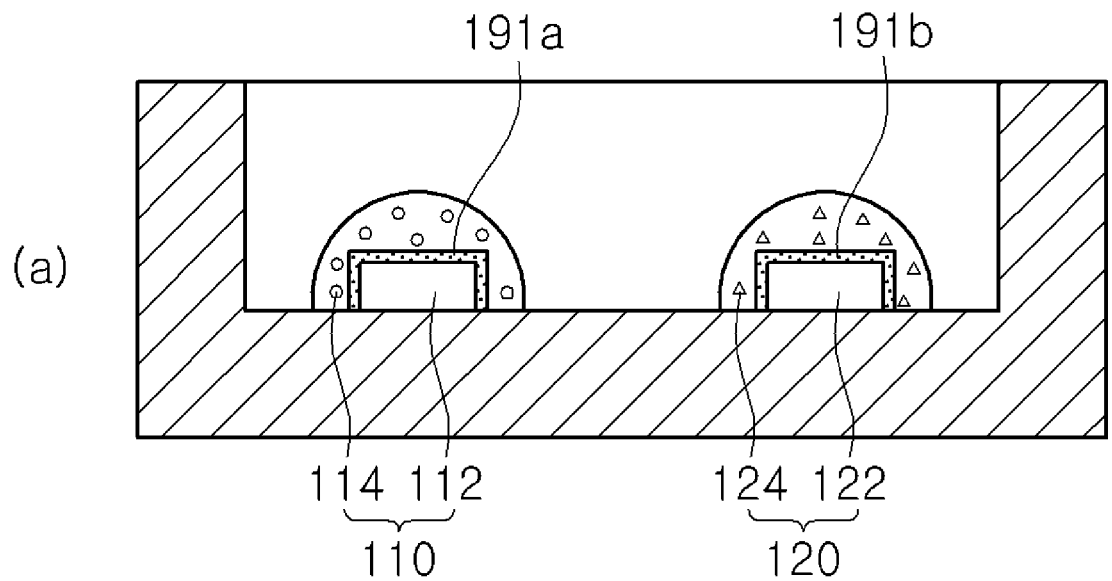
Figure 8:
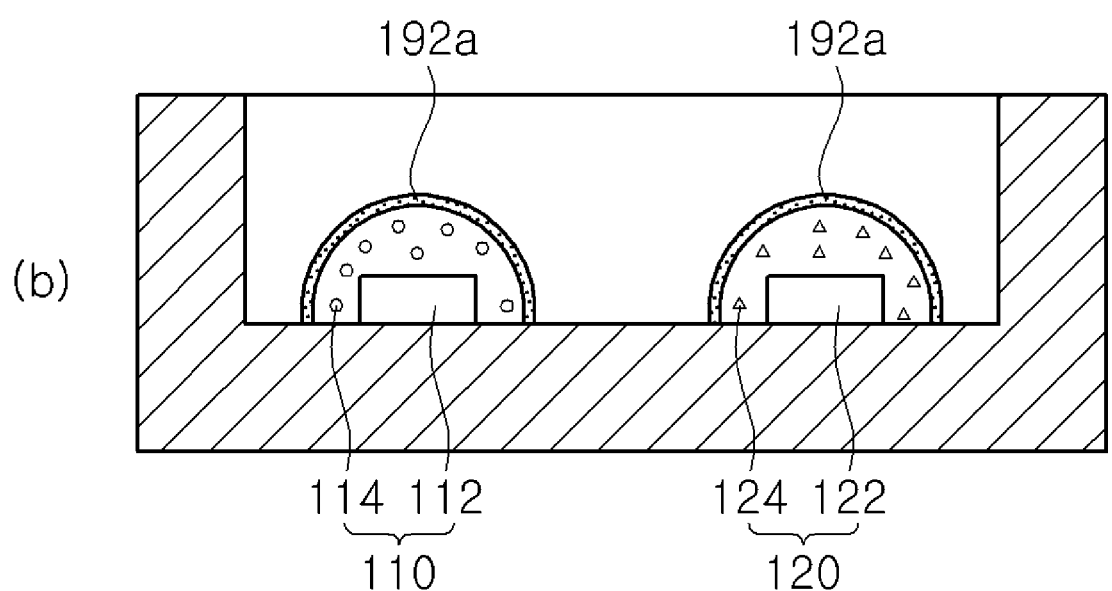

FIG. 7 is a sectional view of a warm white light emitting apparatus according to the seventh exemplary embodiment of the present invention. Referring to FIG. 7, the warm white light emitting apparatus according to this exemplary embodiment includes a layer 190 containing a delay phosphor (hereinafter, referred to as a "delay phosphor layer"). The delay phosphor layer 190 may reduce the flickering of an AC LED 112. An encapsulant 140, which encapsulates both the first and second LED-phosphor combinations 110 and 120, may be made of a silicon or epoxy material and is coated with the delay phosphor layer 190.

The delay phosphor may be a silicate phosphor, an aluminate phosphor, a sulfide phosphor, or the like disclosed in U.S. Pat. Nos. 5,770,111, 5,839,718, 5,885,483, 6,093,346, and 6,267,911, which are all hereby incorporated by reference. For example, the delay phosphor may be (Zn, Cd)S:Cu, $SrAl_2O_4$:Eu, Dy, (Ca, Sr)S:Bi, $ZnSiO_4$:Eu, (Sr, Zn, Eu, Pb, Dy)O.(Al, Bi)$_2$O$_3$, m(Sr, Ba)O.n(Mg, M)O.2(Si, Ge)O$_2$:Eu, Ln, or the like, where $1.5 \leq m \leq 3.5$, $0.5 \leq n \leq 1.5$, M may be at least one element selected from the group consisting of Be, Zn, and Cd, and Ln may be at least one element selected from the group consisting of Sc, Y, La, Ce, Pr, Nd, Sm, Gd, Tb, Dy, Ho, Er, Tm, Yb, K, Lu, B, Al, Ga, In, Tl, Sb, Bi, As, P, Sn, Pb, Ti, Zr, Hf, V, Nb, Ta, Mo, W, Cr, and Mn. The delay phosphor is excited by a portion of light generated from the first and second LED-phosphor combinations 110 and 120 and then emits light in a visible light region, e.g., red, green, and/or blue light.

The decay time of the delay phosphor may be 1 msec or more, more preferably 8 msec or more. The maximum decay time of the delay phosphor may vary depend on the use of the light emitting apparatus. Although the maximum decay time of the delay phosphor is not specifically limited, it may be 10 hours or less.

Unlike the previous exemplary embodiment, a delay phosphor may be independently applied to a first LED-phosphor combination 110 and/or a second LED-phosphor combination 120, which is shown in FIG. 8(a) and FIG. 8(b) according to the eighth exemplary embodiment of the present invention.

Referring to FIG. 8(a), delay phosphor layers 191a and 191b may be directly is formed on respective surfaces of an AC LED 112 of the first LED-phosphor combination 110 and a DC LED 122 of the second LED-phosphor combination 120 by an electrophoresis method, for example. Referring to FIG. 8(b), delay phosphor layers 192a and 192b may be directly formed on respective surfaces of a resin portion containing a general yellow phosphor 114 of the first LED-phosphor combination 110 and a resin portion containing a general red phosphor 124 of the second LED-phosphor combination 120. Alternatively, a delay phosphor may be contained in the resin portions of the first and second LED-phosphor combinations 110 and 120 or only in the resin portion of the first LED-phosphor combination 110.

Figure 9:
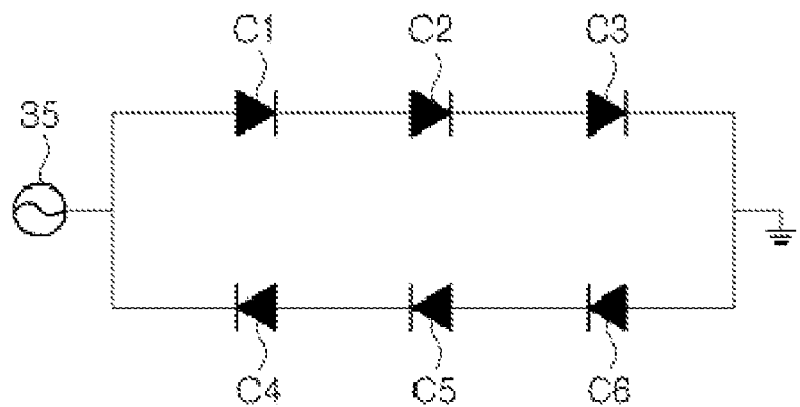
FIG. 9 and FIG. 10 are circuit diagrams showing examples of AC LEDs of an LED-phosphor combination to generate a base light among the LED-phosphor combinations of FIG. 1, FIG. 2, FIG. 3, FIG. 4, FIG. 5, FIG. 6, FIG. 7, and FIG. 8.
Figure 10:
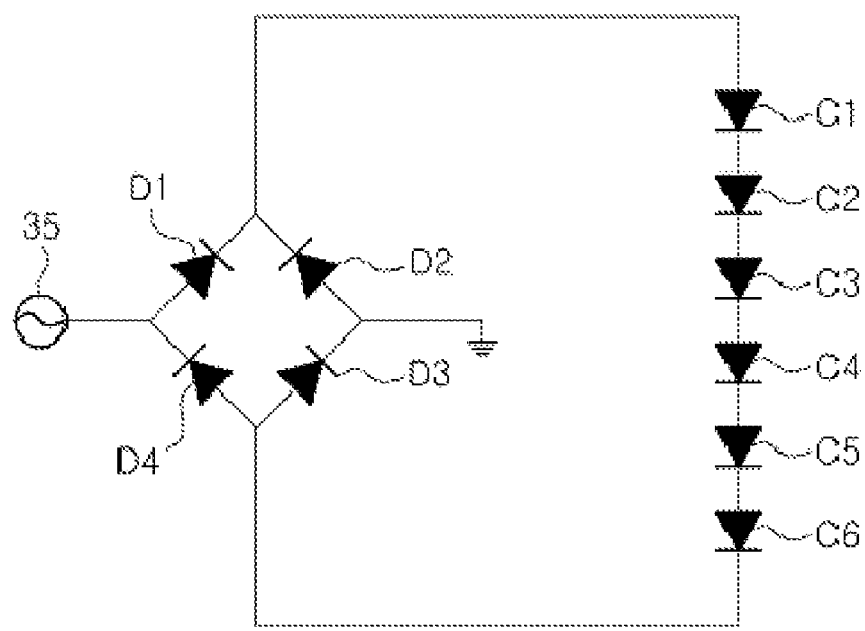
Figure 11:
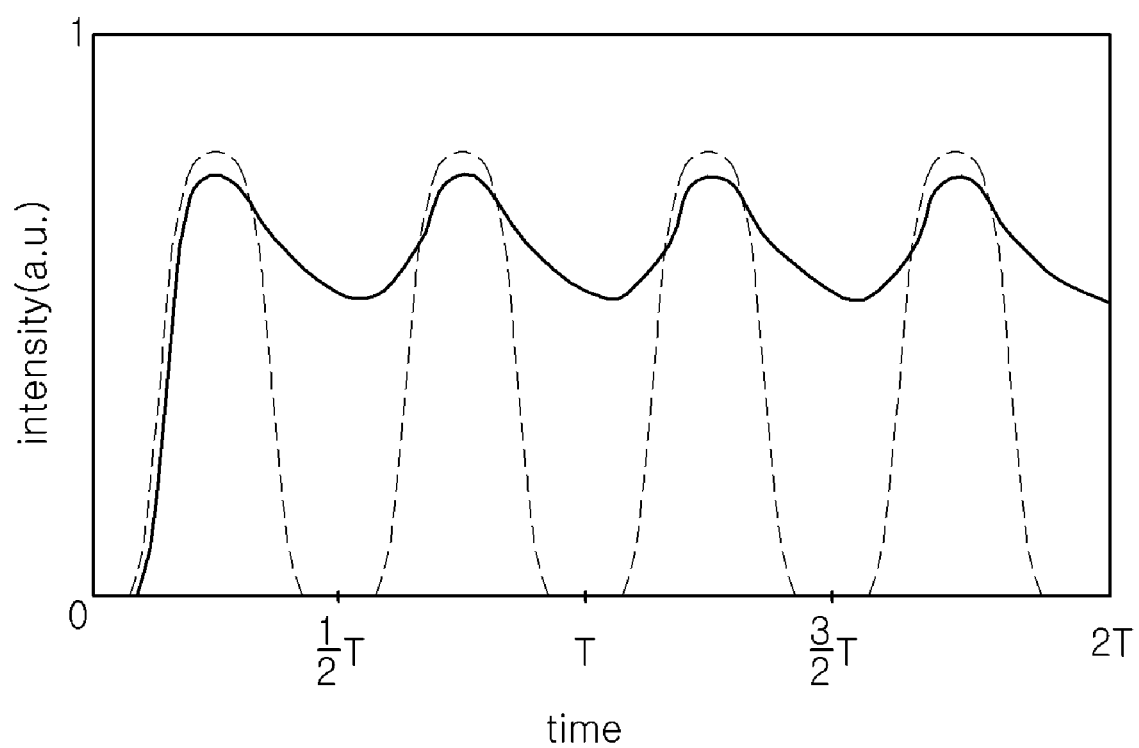
FIG. 11 is a graph showing light emitting characteristics of an AC LED using a delay phosphor.

FIG. 9 and FIG. 10 are circuit diagrams showing examples of AC LEDs, which may be used in the aforementioned first LED-phosphor combination. FIG. 11 is a graph showing the effect of the aforementioned delay phosphor.

Referring to FIG. 9, light emitting cells $C_1$, $C_2$, and $C_3$ of an AC LED are connected in series to form a first serial light emitting cell array, and the other light emitting cells $C_4$, $C_5$, and $C_6$ are connected in series to form a second serial light emitting cell array. Here, the "serial light emitting cell array" refers to an array of a plurality of light emitting cells connected in series. Both ends of each of the first and second serial light emitting cell arrays are connected to an AC power source 35 and a ground through lead terminals, respectively. The first and second serial arrays are connected in reverse parallel between the AC power source 35 and the ground. Therefore, when the AC power source 35 has a positive phase, the light emitting cells $C_1$, $C_2$ and $C_3$ constituting the first serial light emitting cell array are turned on. When the AC power source 35 has a negative phase, the light emitting cells $C_4$, $C_5$, and $C_6$ constituting the second serial light emitting cell array are turned on.

Referring to FIG. 10, light emitting cells $C_1$, $C_2$, $C_3$, $C_4$, $C_5$, and $C_6$ constitute a is serial light emitting cell array, and a bridge rectifier including diode cells $D_1$, $D_2$, $D_3$, and $D_4$ is disposed between an AC power source 35 and the serial light emitting cell array and between a ground and the serial light emitting cell array. An anode terminal of the serial light emitting cell array is connected to a node between the diode cells $D_1$ and $D_2$, and a cathode terminal of the serial light emitting cell array is connected to a node between the diode cells $D_3$ and $D_4$. A terminal of the AC power source 35 is connected to a node between the diode cells $D_1$ and $D_4$, and the ground is connected to a node between the diode cells $D_2$ and $D_3$. When the AC power source has a positive phase, the diode cells $D_1$ and $D_3$ are turned on, and the diode cells $D_2$ and $D_4$ are turned off. Therefore, current flows to the ground via the diode cell $D_1$, the serial light emitting cell array, and the diode cell $D_3$. On the other hand, when the AC power source 35 has a negative phase, the diode cells $D_1$ and $D_3$ are turned off, and the diode cells $D_2$ and $D_4$ are turned on. Therefore, current flows to the AC power source via the diode cell $D_2$, the serial light emitting cell array, and the diode cell $D_4$.

The dotted curve of FIG. 11 shows a light emitting characteristic of a light emitting apparatus having an AC LED without a delay phosphor, while the solid curve of FIG. 11 shows a light emitting characteristic of a light emitting apparatus having an AC LED including a delay phosphor. Here, a DC LED included in the light emitting apparatus is intentionally not operated.

Referring to FIG. 11, when the delay phosphor is not used, the light emitting apparatus is periodically turned on/off when AC voltage is applied thereto. Assuming that a period of the AC voltage is T, two arrays of light emitting cells connected in series alternately operate once during a period of T. Therefore, the light emitting apparatus emits light every period of T/2, as indicated by the dotted curve. When the AC voltage does not exceed the is threshold voltage of the light emitting cells connected in series, the light emitting cells do not operate. Therefore, the light emitting cells are in an off state for a certain period between times at which the light emitting cells operate, i.e., a period when the AC voltage is smaller than the threshold voltage of the light emitting cells. Accordingly, the AC LED may cause flickering to occur in the light emitting apparatus due to the interval between the times at which the light emitting cells operate.

When the delay phosphor is used, light is still emitted while the light emitting cells are turned off, as indicated by the solid curve. Therefore, although light intensity may be varied, the time when light is not emitted may be shortened. If the decay time of the delay phosphor is long, the light emitting apparatus may continuously emit light. When a general household AC power source applies voltage having a frequency of about 60 Hz, one cycle of the power is about 16.7 msec, and a half cycle of the power is about 8 msec. Therefore, while the light emitting apparatus operates, the time when the light emitting cells are all turned off is shorter than 8 msec, so that when the decay time of the delay phosphor is 1 msec or more, flickering may be sufficiently reduced. Particularly, when the decay time of the delay phosphor is similar to the time when the light emitting cells are all turned off, the light emitting apparatus may continuously emit light.

The delay phosphor may be further provided in addition to the phosphors of the aforementioned first and second LED-phosphor combinations. Alternatively, the phosphors of the first and second LED-phosphor combinations may be replaced by delay phosphors.

The warm white light emitting apparatuses having a structure in which first and second LED-phosphor combinations are all positioned in a single package have been described in the previous exemplary embodiments. On the other hand, a warm white light emitting is apparatus according to a ninth exemplary embodiment of the present invention, shown in FIG. 12, has a structure in which first and second LED-phosphor combinations are positioned in different packages, respectively.

Use of Plurality of Packages: Ninth Exemplary Embodiment

Figure 12:
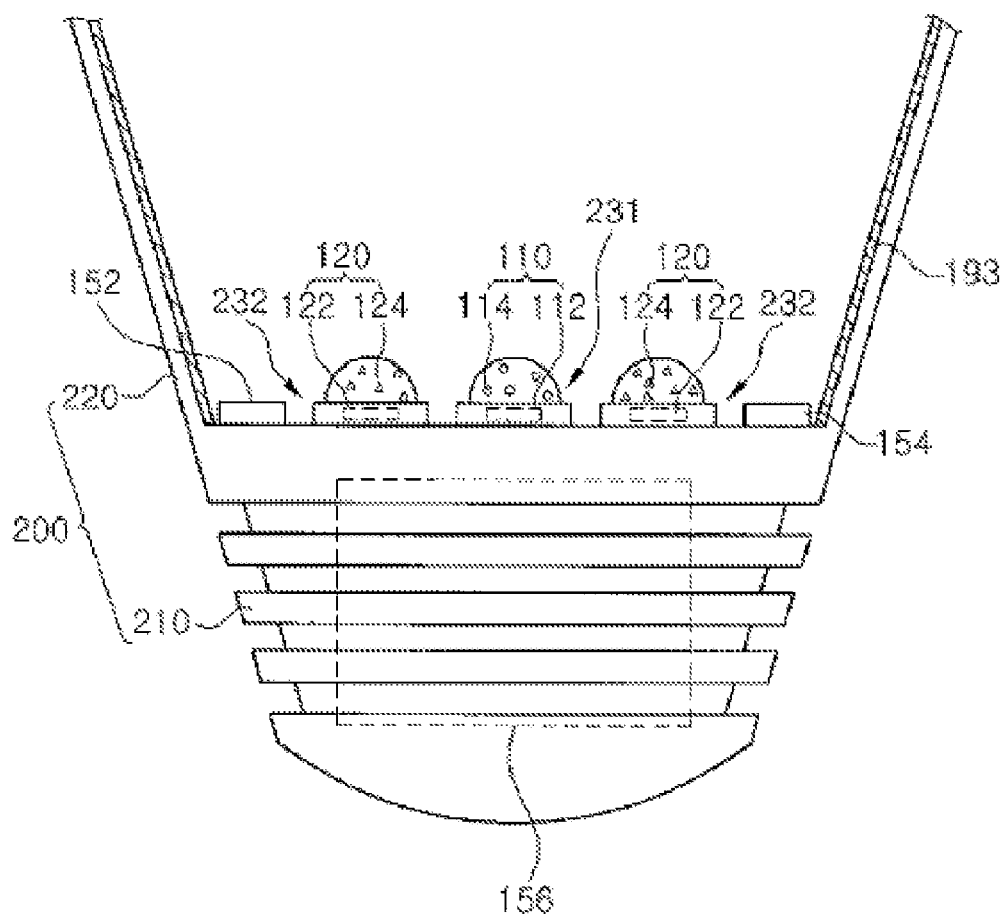
FIG. 12 is a sectional view of a warm white light emitting apparatus including LED-phosphor combinations respectively positioned in a plurality of packages according to an exemplary embodiment of the present invention.

Referring to FIG. 12, the warm white light emitting apparatus according to the ninth exemplary embodiment of the present invention comprises a frame 200 having a base portion 210 and a reflective portion 220. A first package 231 is positioned on a central portion of the top surface of the base portion 210, and a plurality of second packages 232 are positioned around the first package 231. A first LED-phosphor combination 110 to generate base light of white or yellowish white is included in the first package 231, and a second LED-phosphor combination 120 to generate CRI adjusting light is included in each of second package 232.

As in the previous exemplary embodiments, the first LED-phosphor combination 110 includes an AC LED 112 to emit blue light and one or more phosphors 114 having a peak wavelength of 500 to 600 nm. The second LED-phosphor combination 120 includes a blue or UV LED 122 and one or more phosphors 124 having a peak wavelength greater than 600 nm.

An anti-flickering circuit unit 152 and/or an anti-THD circuit unit 154 may be installed on the base portion 210. Also, the base portion 210 may be provided with a circuit 156, which has various components including a heat dissipation system, a ballast, a driver, and/or a driving circuit. The reflective portion 220 reflects a portion of light generated from the first and second LED-phosphor combinations 110 and 120, in which a delay phosphor layer 193, which reduces flickering of an AC LED, is formed on an inner surface of the reflective portion 220.

Hereinafter, backlight modules that include a warm white light emitting apparatus is according to an exemplary embodiment of the present invention will be described with reference to FIG. 13 and FIG. 14.

Backlight Module

Figure 13:
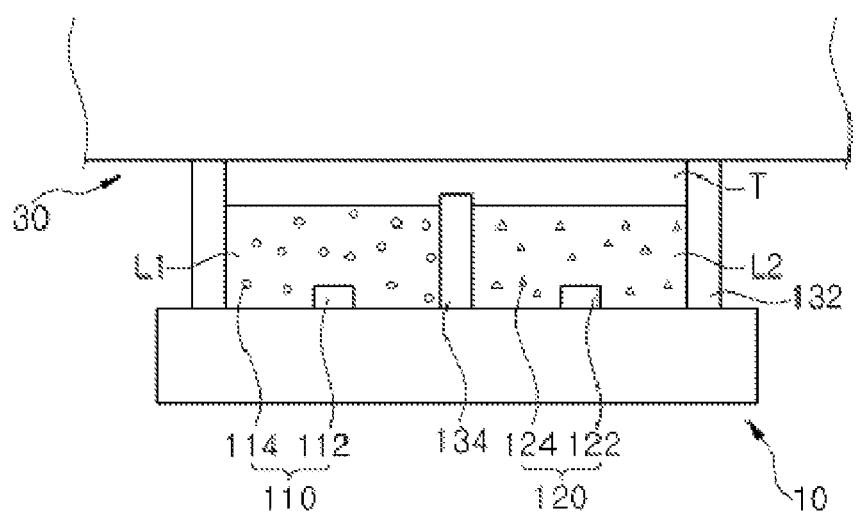
FIG. 13 and FIG. 14 are sectional views showing backlight modules that each include a warm white light emitting apparatus according to an exemplary embodiment of the present invention.

Referring to FIG. 13, the backlight module includes a light guide plate 30 and a light emitting apparatus 10 to supply light to the light guide plate 30. The light emitting apparatus 10 is adjacent to a side surface of the light guide plate 30 and includes an outer wall 132 to accommodate first and second LED-phosphor combinations 110 and 120 therein. A partition wall 134 to separately accommodate the first and second LED-phosphor combinations 110 and 120 is formed in a cavity defined by the outer wall 132. The height of the partition wall 134 is lower than that of the outer wall 132. Therefore, a region in which base light of white or yellowish white generated from the first LED-phosphor combination 110 may be mixed with pink CRI adjusting light generated from the second LED-phosphor combination 120 is provided adjacent to the side surface of the light guide plate 30.

A first blue LED 112 is positioned at the left side of the partition wall 134, and a flat first phosphor resin layer L1, which covers the first blue LED 112 and contains one or more phosphors 114 having a peak wavelength of 500 to 600 nm, is formed to a height lower than that of the partition wall 134. In addition, a second blue LED 122 is positioned at the right side of the partition wall 134, and a flat second phosphor resin layer L2, which covers the second blue LED 122 and contains one or more phosphors 124 having a peak wavelength greater than 600 nm, is formed to a height lower than that of the partition wall 134. A transparent resin layer T is formed to cover the first and second phosphor resin layers L1 and L2.

The transparent resin layer T may have the same height as the outer wall 132 to be in contact with the side of the light guide plate 30.

Figure 14:
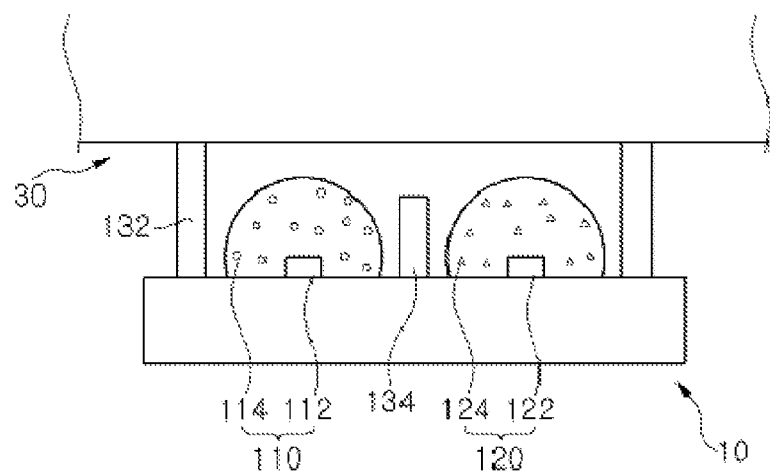

The backlight module shown in FIG. 14 includes a light emitting apparatus 10 having a partition wall 134, which is smaller than an outer wall 132. First and second LED-phosphor combinations 110 and 120 are separated by the partition wall 134. However, this backlight module is different from the backlight module of the previous exemplary embodiment in that resin portions containing phosphors 114 and 124 of the combinations 110 and 120 are formed in a hemispherical shape and the transparent resin layer T is omitted. Each hemispherical resin portion, in which phosphors 114 and 124 of the first and second LED-phosphor combinations 110 and 120 are respectively contained, has a height lower than that of the outer wall 132.

According to exemplary embodiments of the present invention, warm white light having a high color rendering property near a BBL curve, which may be difficult for a conventional LED-phosphor combination to provide, may be simply provided by employing a first LED-phosphor combination to generate base light of white or yellowish white and a second LED-phosphor combination to generate CRI adjusting light to allow the base light to be drawn near the BBL curve.

According to exemplary embodiments of the present invention, high quality warm white light near a BBL curve may be simply provided using two LED-phosphor combinations. An AC LED is used as an LED of the LED-phosphor combination to generate the base light, thereby providing a warm white light emitting apparatus suitable for a large-sized electronic display board or large-sized monitor. Further, a DC LED may be used as an LED of the LED-phosphor combination to generate the CRI adjusting light, whereby flickering of the warm white light emitting apparatus may be reduced. Furthermore, a delay phosphor, an anti-flickering circuit unit, and/or an anti-THD circuit unit may be further provided in the warm white light is emitting apparatus so that flickering and/or THD of the AC LED may be further reduced.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A warm white light emitting apparatus, comprising:
    a first combination of at least one alternating current (AC) light emitting diode (LED) and at least one phosphor to generate a base light, the base light being white or yellowish white; and
    a second combination of at least one direct current (DC) LED and at least one phosphor to generate a Color Rendering Index (CRI) adjusting light,
    wherein the base light and the CRI adjusting light together make a warm white light.

2. The warm white light emitting apparatus of claim 1, wherein the warm white light has a color temperature of 2500 to 4500K.

3. The warm white light emitting apparatus of claim 1, wherein the base light exists in a rectangular region defined by color coordinates (0.29, 0.45), (0.33, 0.37), (0.52, 0.47), and (0.45, 0.54) on a Commission on Illumination (CIE) chromaticity diagram, and the CRI adjusting light exists in a rectangular region defined by color coordinates (0.36, 0.34), (0.44, 0.20), (0.67, 0.32), and (0.55, 0.44) on the CIE chromaticity diagram.

4. The warm white light emitting apparatus of claim 1, wherein in the first combination, the at least one AC LED comprises a blue LED, and the at least one phosphor has a peak wavelength of 500 to 600 nm.

5. The warm white light emitting apparatus of claim 1, wherein in the second combination, the at least one DC LED comprises a blue LED or an ultraviolet (UV) LED, and the at least one phosphor has a peak wavelength greater than 600 nm.

6. The warm white light emitting apparatus of claim 1, wherein the at least one AC LED comprises a plurality of connected light emitting cells, the light emitting cells respectively comprising semiconductor layers on a single substrate.

7. The warm white light emitting apparatus of claim 1, wherein the at least one AC LED comprises a plurality of connected LED chips, which are mounted on a single submount.

8. The warm white light emitting apparatus of claim 1, wherein at least one of the first combination and the second combination further comprises a delay phosphor.

9. The warm white light emitting apparatus of claim 1, further comprising a delay phosphor contained in an encapsulant, the encapsulant encapsulating both of the first combination and the second combination.

10. The warm white light emitting apparatus of claim 1, wherein the first combination and the second combination are positioned in different packages, respectively.

11. The warm white light emitting apparatus of claim 10, further comprising a frame comprising a base portion having the different packages mounted thereon and a reflective portion to reflect light generated from the first combination and the second combination, wherein the reflective portion comprises a delay phosphor.

12. The warm white light emitting apparatus of claim 1, further comprising an anti-flickering circuit unit connected to the AC LED.

13. The warm white light emitting apparatus of claim 1, further comprising an anti-total harmonic distortion (THD) circuit unit connected to the AC LED.

14. A warm white light emitting apparatus, comprising:
    a first combination of an alternating current (AC) light emitting diode (LED) having a peak wavelength in a blue region and at least one phosphor having a peak wavelength of 500 to 600 nm; and
    a second combination of a direct current (DC) LED having a peak wavelength in an ultraviolet (UV) or blue region and at least one phosphor having a peak wavelength greater than 600 nm.

15. The warm white light emitting apparatus of claim 14, further comprising a delay phosphor.

16. The warm white light emitting apparatus of claim 14, further comprising at least one of and an anti-total harmonic distortion (THD) circuit unit and an anti-flickering circuit unit.

17. The warm white light emitting apparatus of claim 14, wherein the AC LED and the DC LED are individually driven.

18. The warm white light emitting apparatus of claim 14, wherein the first combination and the second combination are disposed in a single package independently of each other.

19. The warm white light emitting apparatus of claim 14, wherein the first combination and the second combination are respectively positioned in corresponding cavities divided by a partition wall in a single package.

20. The warm white light emitting apparatus of claim 14, wherein the corresponding phosphors in the first combination and the second combination are provided to individually cover the corresponding LEDs in the first combination and the second combination, respectively.

21. The warm white light emitting apparatus of claim 14, wherein the first combination and the second combination are contained in different packages, respectively.

22. The warm white light emitting apparatus of claim 21, further comprising a frame comprising a base portion having the different packages mounted thereon and a reflective portion to reflect light generated from the first combination and the second combination.

* * * * *